(12) United States Patent
Gilgen

(10) Patent No.: US 6,287,887 B1
(45) Date of Patent: Sep. 11, 2001

(54) METHOD FOR FABRICATING A SMALL AREA OF CONTACT BETWEEN ELECTRODES

(75) Inventor: Brent Gilgen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,542

(22) Filed: Aug. 31, 2000

Related U.S. Application Data

(62) Division of application No. 08/724,816, filed on Oct. 2, 1996, now Pat. No. 6,147,395.

(51) Int. Cl.$^7$ .................................................. H01L 21/00
(52) U.S. Cl. ............................ 438/95; 438/130; 438/131; 257/4; 257/530
(58) Field of Search ..................................... 438/128, 130, 438/95, 102, 131, 584; 257/4, 41, 530; 365/163

(56) References Cited

U.S. PATENT DOCUMENTS 5,168,334 * 12/1992 Mitchell et al. ......................... 29/68
5,587,623 * 12/1996 Jones ..................................... 313/497

FOREIGN PATENT DOCUMENTS 0 005 265    11/1979  (EP) .
WO 96/41380  12/1996  (WO) .

* cited by examiner

*Primary Examiner*—Charles Bowers
*Assistant Examiner*—Hsien-Ming Lee
(74) *Attorney, Agent, or Firm*—Dickstein Shapiro Morin & Oshinsky, LLP

(57) ABSTRACT

An electrode structure for use in a chalcogenide memory is disclosed. The electrode has a substantially frusto-conical shape, and is preferably formed by undercut etching a polysilicon layer beneath an oxide pattern. With this structure, improved current densities through the chalcogenide material can be achieved.

15 Claims, 6 Drawing Sheets

METHOD FOR FABRICATING A SMALL AREA OF CONTACT BETWEEN ELECTRODES

This application is a division of Ser. No. 08/724,816 filed Oct. 2, 1996 now U.S. Pat. No. 6,147,395.

BACKGROUND OF THE INVENTION

A. Field of the Invention

The present invention relates generally to semiconductor fabrication techniques and, more particularly, to a method for fabricating a small contact area between an upper and lower electrode for use in phase changeable memory devices such as, for example, chalcogenide memory cells.

B. Description of the Prior Art

The use of electrically writable and erasable phase change materials, i.e., materials that can be electrically switched between generally amorphous and generally crystalline states or between different resistive states while in crystalline form, for electronic memory applications is well known in the art. The use of phase change materials is disclosed, for example, in U.S. Pat. No. 5,296,716, in the names of Ovshinsky et al., the disclosure of which is incorporated herein by reference. U.S. Pat. No. 5,296,716 is believed to indicate generally the state of the art, and to contain a discussion of the current theory of operation of chalcogenide materials.

Generally, as disclosed in the Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states, but rather, the material can be switched in incremental steps reflecting changes of local order to provide a "gray scale" represented by a multiplicity of conditions of local order spanning the spectrum from the completely amorphous state to the completely crystalline state.

Chalcogenide material exhibits different electrical characteristics depending upon its state. For example, in its amorphous state the material exhibits lower electrical conductivity than it does in its crystalline state. The operation of chalcogenide memory cells requires that a region of the chalcogenide memory material, called the chalcogenide active region, be subjected to a current pulse typically with a current density between $10^5$ and $10^7$ amperes/cm$^2$, to change the crystalline state of the chalcogenide material within the active region contained within a small pore. This current density may be accomplished by first creating a small opening in a dielectric material that is itself deposited onto a lower electrode material. A second dielectric layer, typically of silicon nitride, is then deposited onto the dielectric layer into the opening. The second dielectric layer is typically about 40 Angstroms thick. The chalcogenide material is then deposited over the second dielectric and into the opening. An upper electrode material is then deposited over the chalcogenide material. Carbon is commonly used as the electrode material, although other materials have also been used, for example, molybdenum and titanium nitride. A conductive path is then provided from the chalcogenide material to the lower electrode material by forming a pore in the second dielectric layer by a well-known firing process.

Firing involves passing an initial high current pulse through the structure that passes through the chalcogenide material and then provides dielectric breakdown of the second dielectric layer, thereby providing a conductive path via the pore created through the memory cell. Electrically firing the thin nitride layer is not desirable for a high density memory product due to the high current required and the large amount of testing time required for the firing.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (i.e., diameter, thickness and volume), chalcogenide composition, signal pulse duration and signal pulse waveform shape have an effect on the magnitude of the dynamic range of resistances, the absolute endpoint resistances of the dynamic range, and the currents required to set the memory cells at these resistances. For example, relatively large pore diameters, e.g., about one micron, will result in higher programming current requirements, while relatively small pore diameters, e.g., about 500 Angstroms, will result in lower programming current requirements. The most important factor in reducing the required programming current is the pore cross sectional area.

The energy input required to adjust the crystalline state of the chalcogenide active region of the memory cell is directly proportional to the dimensions of the minimum lateral dimension of the pore, e.g., smaller pore sizes result in smaller energy input requirements. Conventional chalcogenide memory cell fabrication techniques provide minimum lateral pore dimension, diameter or width of the pore, that is limited by the photolithographic size limit. This results in pore sizes having minimum lateral dimensions down to approximately 0.35 microns. However, further reduction in pore size is desirable to achieve improved current density for writing to the memory cell.

SUMMARY OF THE INVENTION

The present invention is directed at overcoming, or at least reducing the effects of, one or more of the problems set forth above. In particular, the present invention provides a method for fabricating a small contact area between electrodes of chalcogenide memory cells, such that the contact area provides minimum dimensions below the photolithographic limit, thereby reducing the required energy input to the chalcogenide active region in operation. The electrodes are further selected to provide material properties that permit enhanced control of the current passing through the chalcogenide memory cell. As a result, the memory cells may be made smaller to provide denser memory arrays, and the overall power requirements for the memory cells are minimized.

Additional advantages of the invention will be set forth in part in the description that follows, and in part will be obvious from the description, or may be learned by practice of the invention.

In accordance with the purpose of the invention, as embodied and broadly described herein, the invention comprises a method of manufacturing a semiconductor device comprising the steps of providing a conductive layer on a substrate; patterning the conductive layer to form a raised portion of the conductive layer; providing an insulating layer on the conductive layer including the raised portion; and selectively removing a portion of the insulative layer to expose part of the raised portion of the conductive layer.

In another aspect, the present invention comprises an integrated circuit device comprising: a substrate having a primary surface; a conductive layer provided on the primary surface, the conductive layer having a raised portion; an insulative layer overlying the first conductive layer and exposing part of the raised portion; and a layer of programmable resistive material provided in contact with the exposed part of the raised portion of the first conductive layer, the exposed part of the raised portion being narrower than remaining part of the raised portion of the first conductive layer.

In still another aspect, the present invention comprises an integrated circuit comprising: a first electrode having a first portion and a second portion, a width of the first electrode narrowing continuously in a direction from the second portion to the firs portion of the first electrode; a layer of programmable resistive material provided in contact with the first electrode; and a second electrode coupled to the layer of programmable resistive material.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the present invention and, together with the description, serve to explain the principles of the invention. In the drawings:

FIG. 4(*b*) is an overhead view of a generally circular contact pattern formed from the resist material and silicon oxide layers;

DESCRIPTION OF THE PREFERRED EMBODIMENT

A method of fabricating a small area of contact between electrodes of chalcogenide memories is presented that provides an area of contact with the lower electrode by the upper electrode, via the chalcogenide material, that is smaller than that presently provided using conventional photolithographic techniques. In particular, the preferred embodiment of the present invention provides a method of fabricating electrodes for chalcogenide memories in which a minimum area of contact of the lower electrode with the upper electrode is formed by creating a tip on the lower electrode. In this manner, the lower electrode having a minimum area of contact as small as 0.00785 $\mu m^2$ is obtained. The present preferred embodiment thus provides enhanced control of the current passing through the resulting chalcogenide memory, and thus, reduces the total current and energy input required to the chalcogenide active region if operation. The total current passing through the chalcogenide active region is two milliamps (mA). Thus, the current density required by the preferred embodiment is $1\times10^6$ A/cm$^2$ to $1\times10^7$ A/cm$^2$. Furthermore, the preferred embodiment allows the memory cells to be made smaller and thus allow the production of denser memory arrays, and allows the overall power requirements for the memory cell to be minimized.

Reference will now be made in detail to the present preferred embodiment of the invention, an example of which is illustrated in the accompanying drawings. Wherever possible, the same reference numbers will be used throughout the drawings to refer to the same or like parts.

Figure 1:
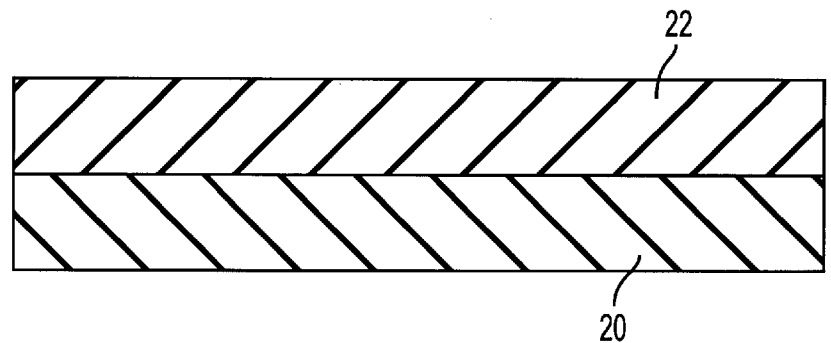
FIG. 1 is a fragmentary cross sectional view of the deposition of a layer of polysilicon onto a substrate of titanium nitride in accordance with a preferred embodiment of the present invention.

Turning to the drawings and referring to FIGS. 1 to 15, a preferred embodiment of a method for fabricating a small area of contact between an upper and lower electrode for chalcogenide memories will now be described. A layer 22 of conductive material, preferably polysilicon, is deposited onto a substrate 20 using conventional thin film deposition methods such as, for example, chemical vapor deposition (CVD), as illustrated in FIG. 1. The layer 22 of conductive material may have a substantially uniform thickness ranging from 5000 to 7000 Angstroms, and preferably will have a substantially uniform thickness of approximately 6500 Angstroms. Substrate 20 may also be comprised of a conductive material such as, for example, silicon, TiN, Carbon WiSi$_x$, or Tungsten, and preferably will be comprised of silicon. The substrate 20 will further preferably comprise a lower electrode grid (not shown) used for accessing an array of chalcogenide memories.

Figure 2:
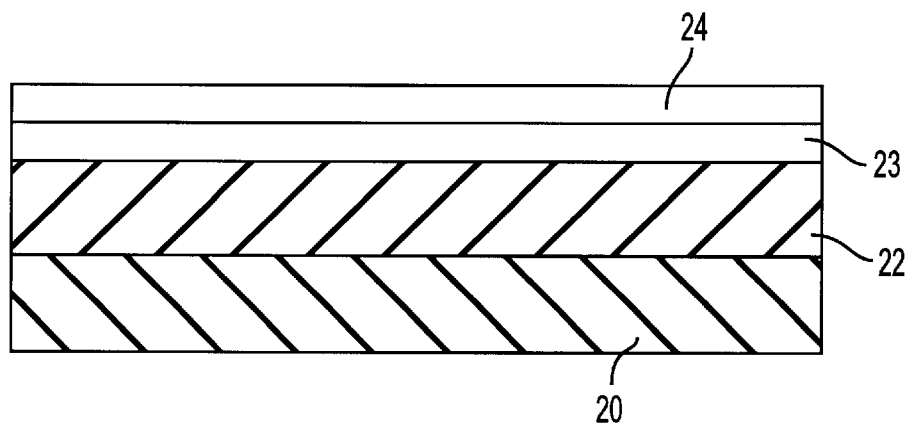
FIG. 2 is a fragmentary cross sectional view of the deposition of a layer of silicon oxide and a layer of resist material onto the layer of polysilicon.

A layer 23 of silicon oxide is deposited onto the substrate 22, preferably by CVD, and preferably will have a thickness of 500 Angstroms. A layer 24 of resist material is spun onto the silicon oxide layer 23, as illustrated in FIG. 2. The layer 24 of resist material preferably will have a substantially uniform thickness of approximately 15,000 Angstroms.

Figure 3:
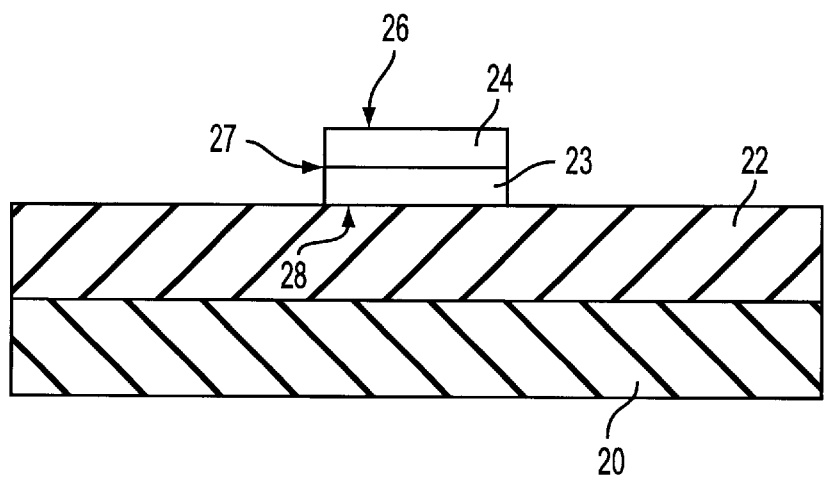
FIG. 3 is a fragmentary cross sectional view of a contact pattern that is etched in the layer of resist material and the silicon oxide layer using etching, masking, and photoresist stripping techniques.
Figure 4A:
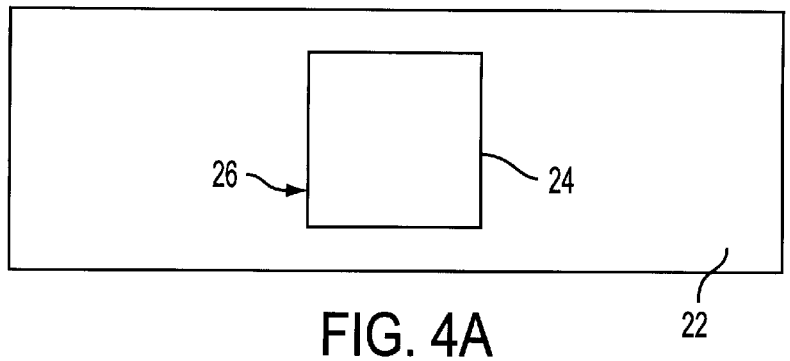
FIG. 4(*a*) is an overhead view of a generally rectangular contact pattern formed from the resist material and silicon oxide layers.
Figure 4B:
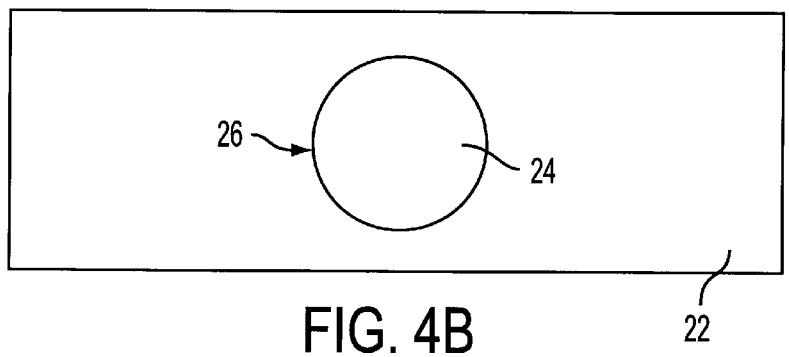

A contact pattern 26, is then etched in the resist layer 24 and the silicon oxide layer 23 using conventional masking, exposing, etching, and photoresist stripping techniques as shown in FIG. 3. The contact pattern 26 may be formed from the resist layer 24 and silicon oxide layer 23, for example, as a generally rectangular block as shown in FIG. 4(a), or as a substantially circular block as shown in FIG. 4(b). Contact pattern 26 is preferably formed using a conventional contact hole mask resulting in the substantially circular block shown in FIG. 4(b). The minimum lateral dimension of the contact pattern 26 preferably will be approximately 0.4 µm. The contact pattern 26 includes a generally horizontal bottom surface 28, common to the polysilicon layer 22, and generally vertical side walls 27 at its outer periphery.

Figure 5:
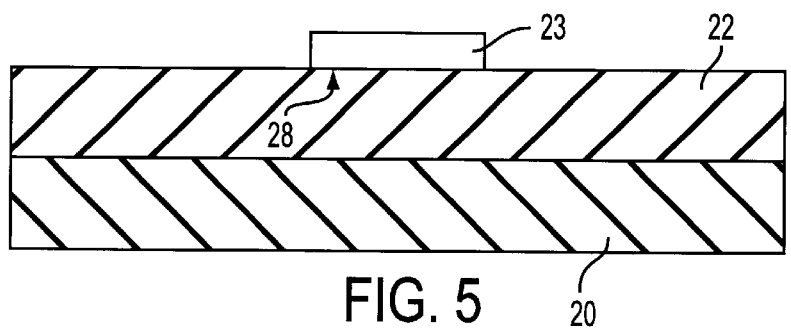
FIG. 5 is fragmentary cross sectional view of the device after the resist material layer has been stripped away using strip etching techniques.

The resist layer 24 is then removed using conventional stripping techniques after the contact 26 has been patterned in the silicon oxide layer 23, as shown in FIG. 5. Thus, the silicon oxide layer 23 remains as the contact pattern 26. The silicon oxide layer 23 contact pattern is used as a masking layer when the polysilicort layer 22 is subsequently etched.

Figure 6:
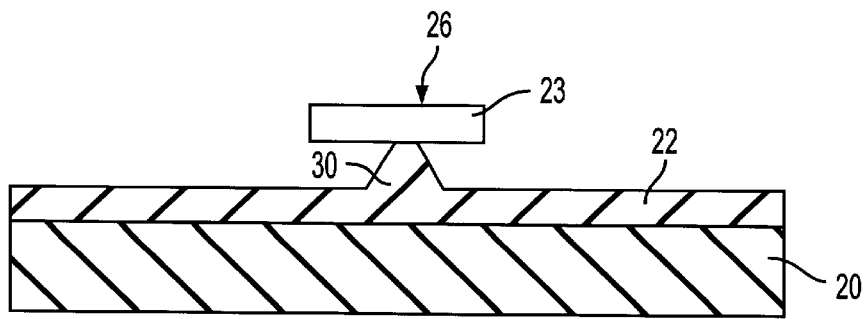
FIG. 6 is a fragmentary cross sectional view of a portion of the layer of polysilicon material not covered by the silicon oxide layer pattern that is etched using conventional undercut isotropic etching techniques to form a frusto-conical-shaped tip in the layer of polysilicon material.
Figure 7:
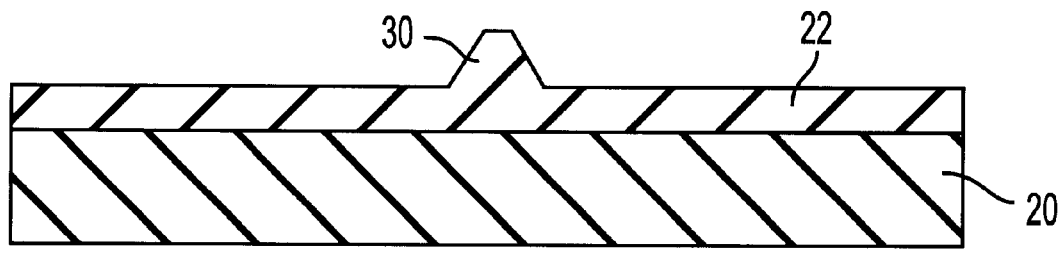
FIG. 7 is a fragmentary cross sectional view of the device after the contact pattern has been removed using conventional wet etch techniques.

The portion of the polysilicon layer 22 not covered by silicon oxide layer pattern 23 is etched, and the portions beneath silicon oxide pattern 23 are undercut, using wet etch or dry plasma etching techniques to form a frusto-conical shaped tip 30 in the polysilicon layer 22, as shown in FIG. 6. The resulting tip 30 is frusto-conical in shape preferably having a minimum frustum lateral dimension of approximately 0.1 µm. The base of the tip 30 preferably will have a base minimum lateral dimension of approximately 0.4 µm, i.e., the same dimension as the lateral dimension of the (contact pattern 26. Tip 30 will preferably have a height of approximately 2000 Angstroms. The removal of the silicon oxide layer pattern 23 is accomplished using conventional wet etch techniques as shown in FIG. 7. Contact pattern 26 thus provides a means for defining the area of contact of the base of the frusto-conical tip 30 of layer 22 of 0.00785 µm$^2$ [$\pi \times (0.1/2)^2$].

Figure 8:
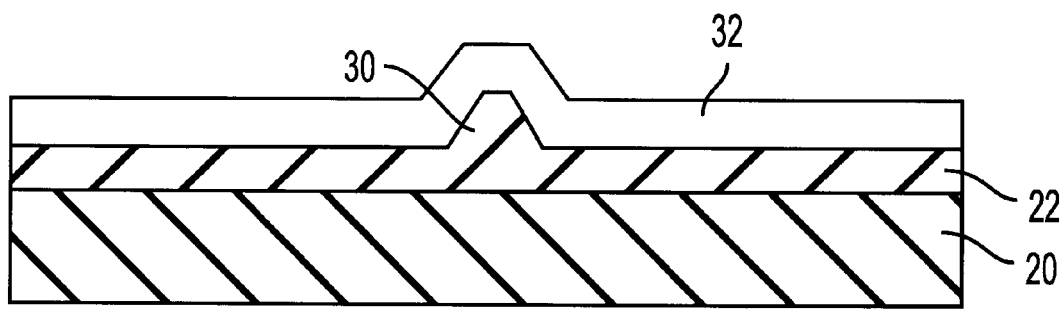
FIG. 8 is a fragmentary cross sectional view of the depositing of a layer of insulative material onto the layer of polysilicon material, including the tip, using conventional thin film deposition methods to isolate the layer of polysilicon material, including the tip.

A layer 32 of insulative material is deposited onto the polysilicon layer 22, including the tip 30, using conventional thin film deposition methods such as, for example, CVD, to isolate the polysilicon layer 22, including the tip 30, as illustrated in FIG. 8. The layer 32 of insulative material may have a substantially uniform hickness of approximately 2000 to 5000 Angstroms, and preferably will have a substantially uniform thickness of approximately 2000 Angstroms, i.e., the same thickness as the height of the tip 30. Layer 32 of insulative material may be comprised of siliicon oxide or silicon nitride, and preferably will be comprised of silicon oxide.

Figure 9:
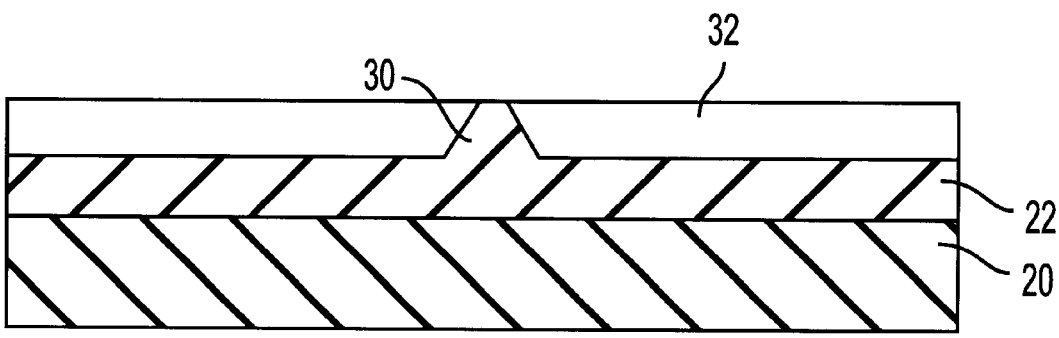
FIG. 9 is a fragmentary cross sectional view of planarization of the layer of insulative material using a conventional chemical mechanical planarization (CMP) process.

The layer 32 of insulative material is then preferably planarized using a conventional chemical mechanical planarization (CMP) process as illustrated in FIG. 9 The CMP process is performed to expose the top surface 24 of the tip 30 formed on the polysilicon layer 22 that may also be referred to as the lower electrode.

The chalcogenide memory cell is then formed incorporating the tip 30 of the polysilicon layer 22 using conventional semiconductor processing techniques such as, for example, thin-film deposition, masking, and etching processes. As showin in FIG. 15, the chalcogenide memory cell preferably includes a layer 34 of chalcogenide material, a layer 36 of conductive material serving as an upper electrode, an interlayer dielectric (ILD) layer 38, and an upper conductive layer 40.

Figure 10:
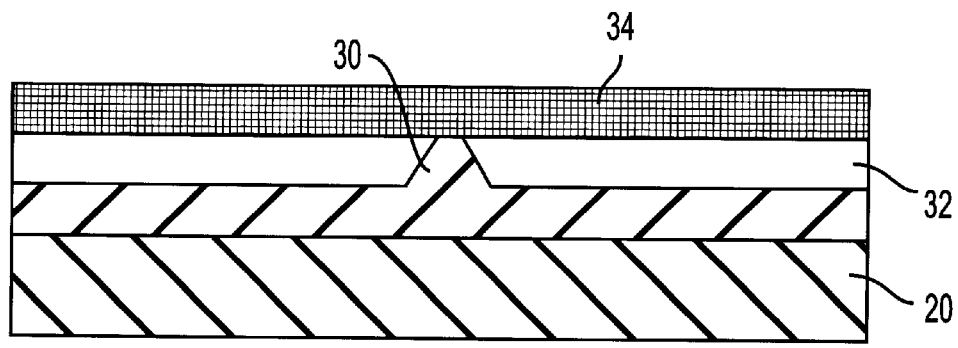
FIG. 10 is a fragmentary cross sectional view of a chalcogenide material layer that is deposited using conventional thin film deposition methods.

The chalcogenide material layer 34 may be deposited using conventional thin film deposition methods, as shown in FIG. 10. Chalcogenide material layer 34 preferably is approximately 500 Angstroms thick. Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% on average, and remain generally below 50% Ge, with the remainder of the principal constituent elements in this class being Sb. The percentages are atomic percentages which total 100% of the atoms of the constituent elements. In a particularly preferred embodiment, the chalcogenide compositions for these memory cells comprise a Te concentration of about 56%, a Ge concentration of about 22%, anc a Sb concentration of about 22%. The materials are typically characterized as $Te_a Ge_b Sb_{100-(a+b)}$, where a is equal to or less than about 70% and preferably between about 40% to about 60%, b is above about 15% and less than 50%, and preferably between about 17% to 44%, and the remainder is Sb.

Figure 11:
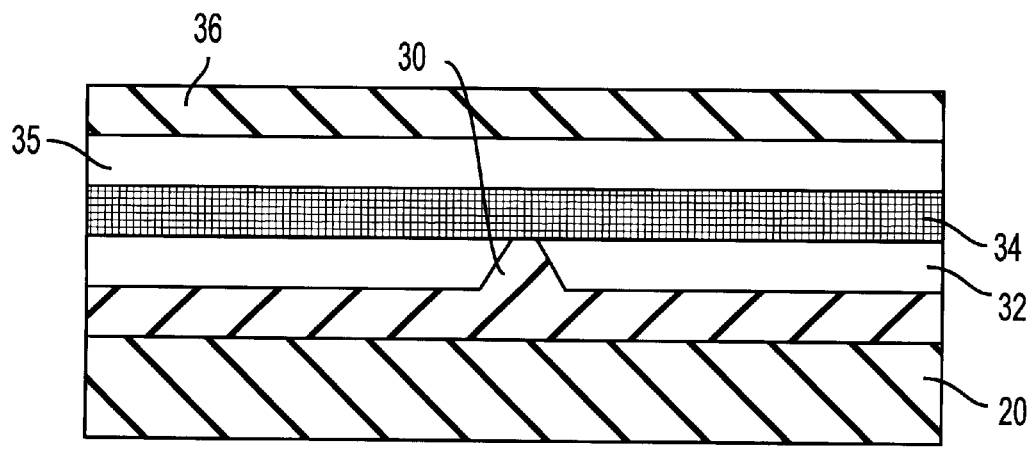
FIG. 11 is a fragmentary cross sectional view of a layer of conductive material deposited over the chalcogenide layer using conventional thin film deposition techniques.
Figure 12:
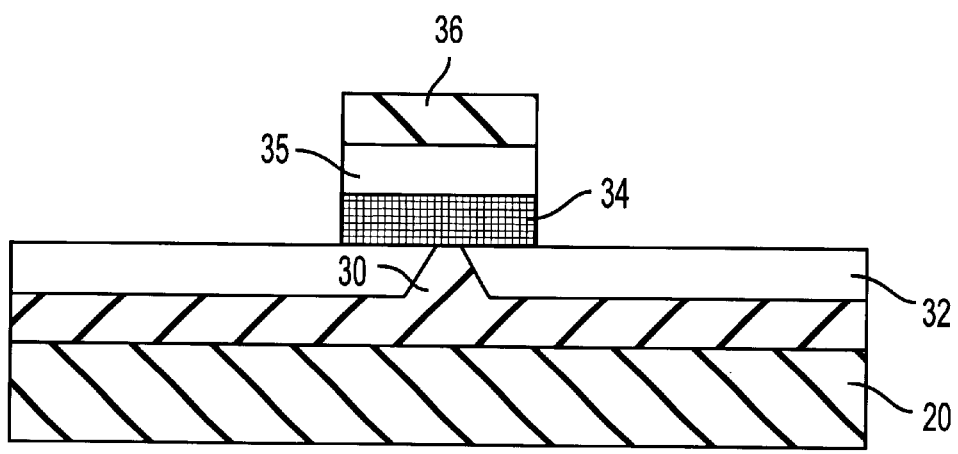
FIG. 12 is a fragmentary cross sectional view of the layer of chalcogenide material and the second layer of conductive material after they are etched back using conventional masking and etching techniques.

The carbon layer 35 is preferably 600 Angstroms thick and is provided over the chalcogenide layer 34 using conventional thin film deposition techniques, as shown in FIG. 11. Layer 36 of conductive material is deposited over the carbon layer 35 using conventional deposition techniques, as further shown in FIG. 11. The layer 36 of conductive material thereby provides an upper electrode for the chalcogenide memory cell. The layer 36 of conductive material is preferably titanium nitride (TiN), but may comprise TiN or carbon, and has a thickness of approximately 500 Angstroms. Layers 34–36 are subsequently etched back using conventional masking and etching techniques, as shown in FIG. 12.

Figure 13:
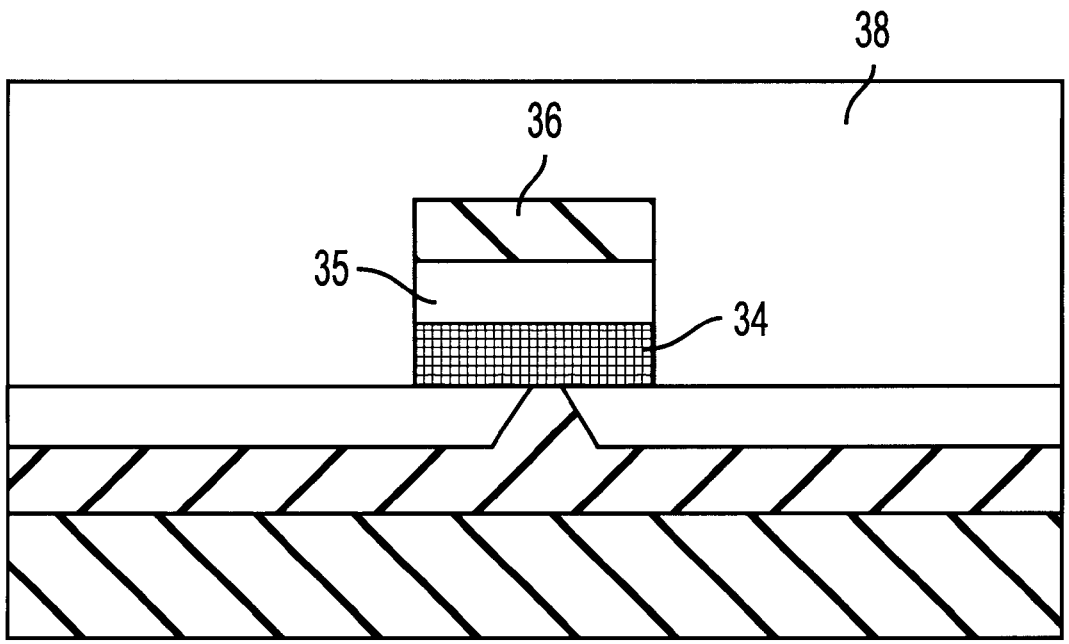
FIG. 13 is a fragmentary cross sectional view of a second layer of insulaitive material that is applied using conventional thin film deposition techniques.
Figure 14:
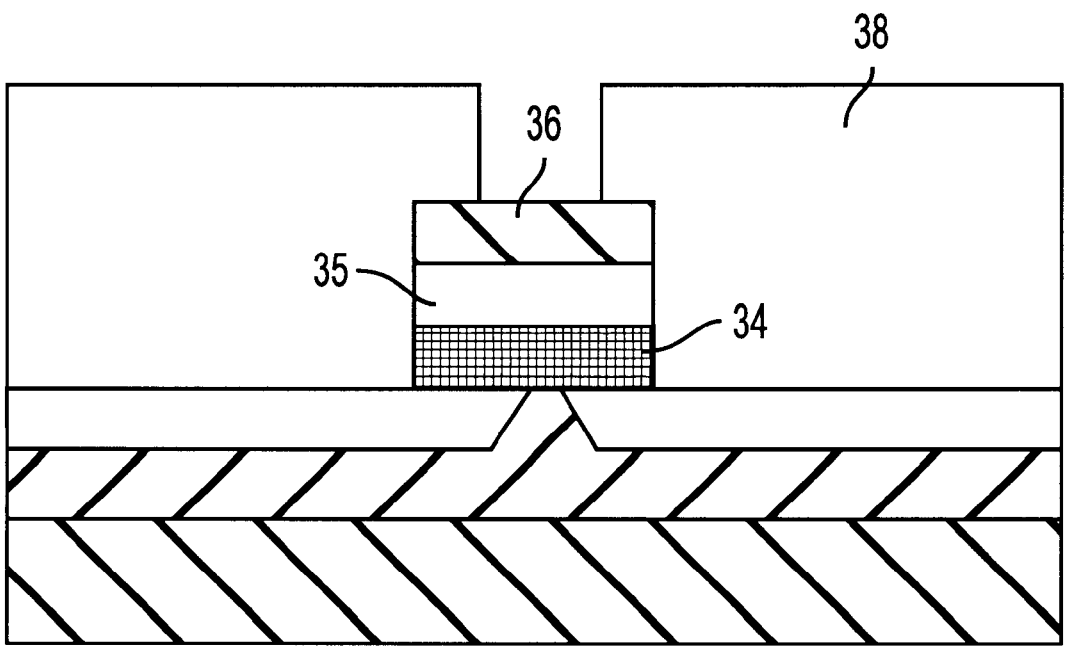
FIG. 14 is a fragmentary cross sectional view of the second layer of insulating material after it is etched back.
Figure 15:
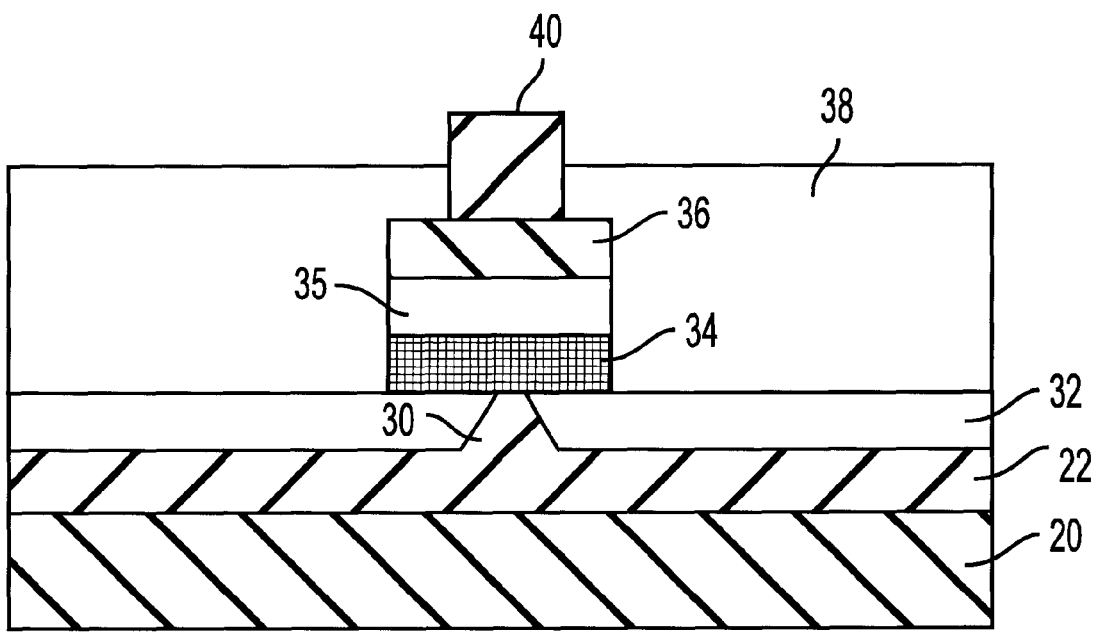
FIG. 15 is a fragmentary cross sectional view of the complete chalcogenide memory cell including an upper conductive grid layer.

As shown in FIG. 13, the ILD layer 38 is then applied using conventional thin film deposition techniques. The ILD layer 38 preferably is approximately 3500 Angstroms thick, and comprises silicon oxide. The ILD layer 38 is then etched back, as shown in FIG. 14, using conventional masking and etching processes to provide access to the layer 36 of conductive material or upper electrode by the upper conductive grid 40. Upper conductive grid interconnect 40 may be formed by first applying a blanket deposition of conductive material using conventional thin film deposition processes and then by etching the conductive material to form the upper conductive grid interconnect extending above the surface of the ILD layer 38, as show in FIG. 15. The upper conductive grid 40 material may comprise materials such as, for example, Ti, TiN, or aluminum, and preferably it will comprise aluminum.

In a particularly preferred embodiment, the methods described above are utilized to form an array of chalcogenide memory cells that are addressable by an X-Y grid of upper and lower conductors, i.e., electrodes. In the particularly preferred embodiment, diodes are further provided in series with the chalcogenide memory cel. to permit read/write operations from/to individual chalcogenide memory cells as will recognized by persons of ordinary skill in the art. The present invention includes the fabrication of a plurality of tips 30 on the lower electrode, i.e., the polysilicon layer 22, such that a plurality of chalcogenide memory cells may be created. The drawings show only a single tip 30 for ease of illustration of the present invention. Furthermore, while a range of materials may be utilized for each layer, the particular materials selected for each layer must be selected to provide proper selectivity during the various etching processes as will be recognized by persons of ordinary skill in the art.

Other embodiments of the invention will be apparent to those skilled in the art from consideration of the specification and practice of the invention disclosed herein. It is intended that the specification and examples be considered as exemplary only, with a true scope and spirit of the invention being indicated by the following claim.

What is claimed is:

1. A method of manufacturing an electrical contact comprising the steps of providing a first conductive layer on a substrate;

patterning said first conductive layer to form a raised portion of said first conductive layer;

providing an insulating layer on said first conductive layer including said raised portion;

selectively removing a portion of said insulative layer to expose part of said raised portion of said first conductive layer;

depositing a programmable resistive material on said exposed part of said raised portion of said first conductive layer; and depositing a second conductive layer in contact with said programmable resisitive material.

2. A method in accordance with claim 1, wherein said programmable resistive material comprises a chalcogenide material.

3. A method in accordance with claim 2, further comprising the steps, before the conductive layer patterning steps, of:

forming a layer of oxide on said first conductive layer; and patterning said oxide layer to form spaced oxide patterns.

4. A method in accordance with claim 3, wherein said conductive layer patterning step comprises etching said first conductive layer so that a raised portion is formed in said first conductive layer below each oxide pattern.

5. A method in accordance with claim 4, wherein the step of providing the insulating layer comprises depositing said insulating layer to the same thickness as said raised portion, the method further comprising the step of:

selectively removing portions of said insulative layer to expose the top part of said raised portion.

6. A method in accordance with claim 5, further comprising the steps of:

forming a pattern of chalcogenide material on each raised portion; and forming a second conductive layer on each pattern of chalcogenide material.

7. A method in accordance with claim 6, wherein said chalcogenide material is selected from the group consisting of Se, Te, Ge, Sb and compositions of at least two of Se, Te, Ge, and Sb.

8. A method in accordance with claim 7, wherein said chalcogenide material includes Te, Ge, and Sb in the ratio $Te_aGe_bSb_{100-(a+b)}$, where a, b, and c are in atomic percentages which total 100% of the constituent elements and $a \leq 70$ and $15 \leq b \leq 50$.

9. A method of fabricating a conductive path in an integrated circuit, comprising the steps of:

applying a conductive layer onto a semiconductor substrate;

applying an oxide layer having spaced patterns onto said conductive layer;

etching said conductive layer so that a tip portion is formed in said conductive layer under each oxide layer pattern;

depositing an insulative layer onto said conductive layer to cover the tip portions of said conductive layer; and selectively removing a portion of said insulative layer to expose a top part of the tip portions of said conductive layer.

10. A method in accordance with 9, wherein said insulative layer its deposited at approximately the same thickness as the height of each tip portion of the conductive layer.

11. A method in accordance with claim 10, wherein said removing step includes chemical mechanical polishing to expose the top part of the tip portions.

12. A method of fabricating a chalcogenide memory cell, comprising the steps of:

applying a first conductive layer onto a substrate;

applying an oxide layer, including a plurality of spaced patterns, onto said first conductive layer;

etching said first conductive layer so that a tip portion is formed under each of the oxide layer patterns;

removing said oxide layer;

depositing an insulating layer onto said first conductive layer including said tip portions;

removing a portion of said insulating layer to expose the top surfaces of the tip portions;

applying a layer of chalcogenide material onto the top surface of each tip portion; and applying a second conductive material onto each pattern of chalcogenide material.

13. A method of fabricating a chalcogenide memory cell in accordance with claim 12, wherein said chalcogenide material is selected from the group consisting of Se, Te, Ge, Sb and compositions of at least two of Se, Te, Ge, and Sb.

14. A method of fabricating a chalcogenide memory cell in accordance with claim 13, wherein said chalcogenide material includes Te, Ge, and Sb in the ratio $Te_aGe_bSb_{100-(a+b)}$, where a, b, and c are in atomic percentages which total 100% of the constituent elements and $a \leq 70$ and $15 \leq b \leq 50$.

15. A method of fabricating a chalcogenide memory cell in accordance with claim 14, wherein $40 \leq a \leq 60$ and $17 \leq b \leq 44$.

* * * * *